(12) United States Patent
Ohmura

(10) Patent No.: US 9,144,978 B2
(45) Date of Patent: Sep. 29, 2015

(54) PRINTHEAD SUBSTRATE AND PRINTING APPARATUS

(71) Applicant: CANON KABUSHIKI KAISHA, Tokyo (JP)

(72) Inventor: Masanobu Ohmura, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 12 days.

(21) Appl. No.: 13/971,173

(22) Filed: Aug. 20, 2013

(65) Prior Publication Data
US 2014/0078223 A1   Mar. 20, 2014

(30) Foreign Application Priority Data

Sep. 18, 2012  (JP) .................. 2012-205033

(51) Int. Cl.
| | |
|---|---|
| *B41J 2/41* | (2006.01) |
| *B41J 2/415* | (2006.01) |
| *G11B 3/00* | (2006.01) |
| *B41J 2/14* | (2006.01) |
| *B41J 2/35* | (2006.01) |

(52) U.S. Cl.
CPC ............. *B41J 2/14427* (2013.01); *B41J 2/35* (2013.01)

(58) Field of Classification Search
None
See application file for complete search history.

(56) References Cited

U.S. PATENT DOCUMENTS

| | | | |
|---|---|---|---|
| 2002/0003280 A1* | 1/2002 | Kohyama | 257/529 |
| 2005/0051849 A1* | 3/2005 | Shimotsusa | 257/368 |
| 2005/0231545 A1* | 10/2005 | Benjamin et al. | 347/19 |
| 2006/0125563 A1* | 6/2006 | Elder | 330/253 |
| 2008/0036033 A1* | 2/2008 | Ito et al. | 257/530 |

FOREIGN PATENT DOCUMENTS

JP        2002-64332 A    2/2002

* cited by examiner

*Primary Examiner* — Erica Lin
(74) *Attorney, Agent, or Firm* — Fitzpatrick, Cella, Harper & Scinto

(57) ABSTRACT

A printhead substrate, comprising an electrothermal transducer configured to heat a printing material, a first DMOS transistor configured to drive the electrothermal transducer, a MOS structure forming an anti-fuse element, a second DMOS transistor configured to write information in the anti-fuse element by causing an insulation breakdown of an insulating film of the MOS structure, and a driving unit consisted of at least one MOS transistor and configured to drive the second DMOS transistor.

24 Claims, 6 Drawing Sheets

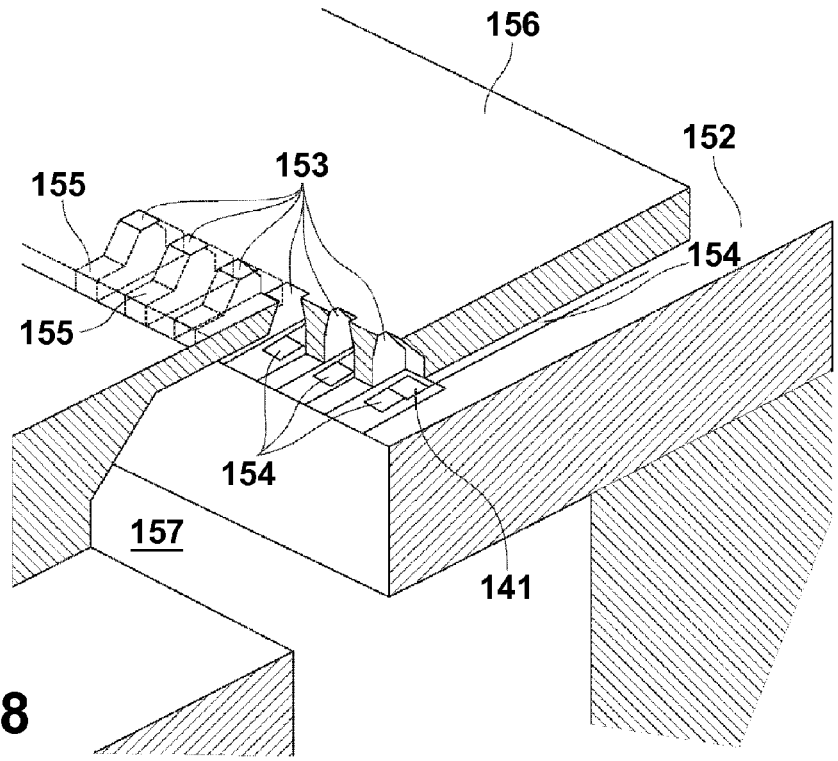
F I G. 8
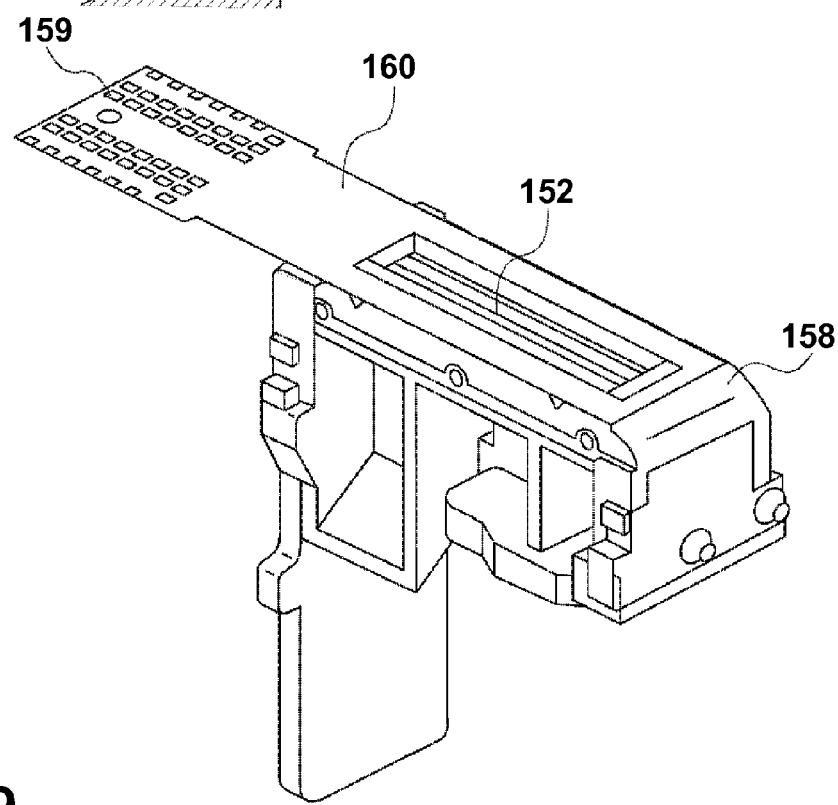
F I G. 9

US 9,144,978 B2

PRINTHEAD SUBSTRATE AND PRINTING APPARATUS

BACKGROUND OF THE INVENTION

1. Field of the Invention

The present invention relates to a printhead substrate and a printing apparatus.

2. Description of the Related Art

To print unique information such as a product ID and setting parameters on a product itself, an anti-fuse element can be used as a memory which is programmable only once. To write information in an anti-fuse element, a voltage higher than that supplied to read out information can be supplied to the anti-fuse element.

It is necessary to design a circuit for writing information in an anti-fuse element to have a structure which withstands the above voltage. Adding such circuit may add steps to the manufacturing process, thereby increasing the cost. The same goes for a printhead substrate.

SUMMARY OF THE INVENTION

The present invention provides a technique advantageous in the manufacturing process of a printhead substrate including an anti-fuse element.

One of the aspects of the present invention provides a printhead substrate, comprising an electrothermal transducer configured to heat a printing material, a first DMOS transistor configured to drive the electrothermal transducer, a MOS structure forming an anti-fuse element, a second DMOS transistor configured to write information in the anti-fuse element by causing an insulation breakdown of an insulating film of the MOS structure, and a driving unit consisted of at least one MOS transistor and configured to drive the second DMOS transistor.

Further features of the present invention will become apparent from the following description of exemplary embodiments with reference to the attached drawings.

BRIEF DESCRIPTION OF DRAWINGS

FIG. 8 is a view for explaining part of an example of the arrangement of a printhead substrate and ink supply unit;

FIG. 9 is a view for explaining part of an example of the arrangement of a printhead.

DESCRIPTION OF THE EMBODIMENTS (First Embodiment)

Figure 1:
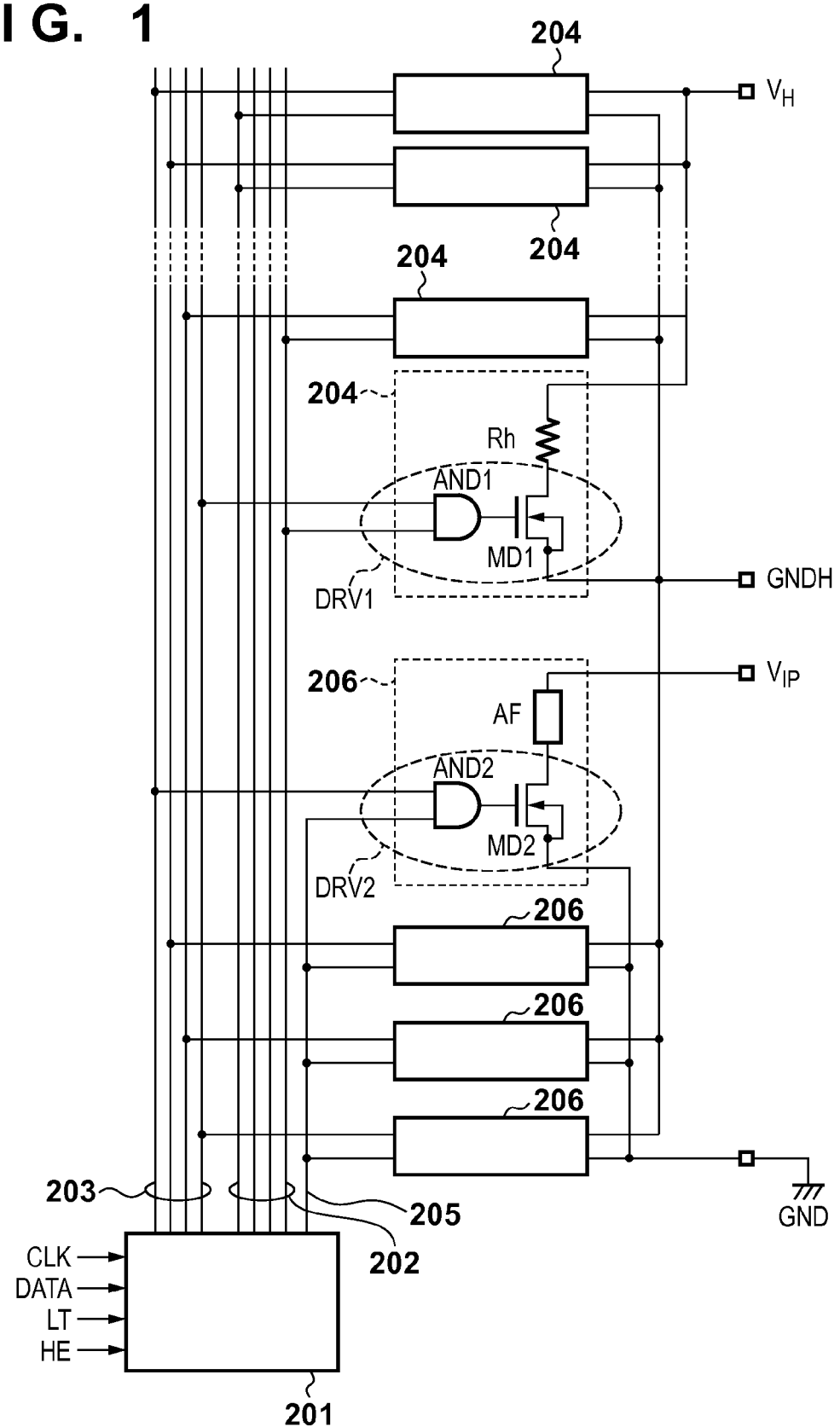
FIG. 1 is a circuit diagram for explaining part of an example of the circuit arrangement of a printhead substrate.

A printhead substrate $I_1$ (to be simply referred to as a "substrate $I_1$" hereinafter) according to the first embodiment will be described with reference to FIGS. 1 to 5. FIG. 1 shows part of an example of the circuit arrangement of the printhead substrate $I_1$. The substrate $I_1$ includes printing units 204 and memory units 206. Each printing unit 204 includes a heater Rh (electrothermal transducer), and a driving unit DRV1 (a transistor MD1 and AND circuit AND1) for driving the heater Rh. By driving the heater Rh, that is, by supplying a current to the heater Rh to generate heat, a printing material is discharged, thereby enabling printing (to be described later). Each memory unit 206 includes an anti-fuse element AF, and a driving unit DRV2 (a transistor MD2 and AND circuit AND2) for writing information in the anti-fuse element AF. The anti-fuse element AF is supplied with an overvoltage to permanently hold information, that is, functions as a memory which is programmable only once. The driving units DRV1 and DRV2 are controlled by signals from a control circuit 201. The control circuit 201 can be formed from, for example, a shift resistor and latch circuit (neither are shown). A clock signal CLK, an image data signal DATA, a latch signal LT, and a heater control signal HE can be input to the control circuit 201 via, for example, a host PC (not shown). Furthermore, a first power supply voltage $V_{DD}$ (for example, 3 to 5 V) can be supplied as a logic power supply voltage to the AND circuits AND1 and AND2 and control circuit 201.

For each of m groups each including n printing units 204, the control circuit 201 can control the operations of the included printing units 204 to perform time-divisional drive for driving the heaters Rh. The control circuit 201 can output an m-bit block selection signal 202 and an n-bit time-divisional selection signal 203, thereby performing time-divisional drive.

The corresponding block selection signal 202 and time-divisional selection signal 203 are input to the AND circuit AND1. In response to this, the transistor MD1 is set in a conductive state to drive the heater Rh connected in series with the transistor MD1. A DMOS transistor (Double-diffused MOSFET) serving as a high-breakdown voltage MOS transistor is used as the transistor MD1 (a first DMOS transistor). The AND circuit AND1 can be formed from a MOS transistor. Note that a second power supply voltage VH (for example, 24 V) is supplied as a power supply voltage for driving the heater to the printing unit 204 and GNDH represents a ground potential. As described above, the substrate $I_1$ includes driving units (corresponding to the printing units 204) each of which includes a printing element for printing and a driving element for driving the printing element, and a logic unit (corresponding to the control circuit 201) for controlling the driving units. In general, to cause the driving unit to operate at a voltage higher than that of the logic unit, a substrate including a high-breakdown voltage transistor and a general transistor can be used.

A control signal 205 and the time-divisional selection signal 203 are input to the AND circuit AND2, and corresponding signals are output to the transistor MD2, thereby switching between the conductive state and non-conductive state of the transistor MD2. Similarly to the transistor MD1, a DMOS transistor is used as the transistor MD2 (a second DMOS transistor). The AND circuit AND2 can be formed from a MOS transistor. A third power supply voltage $V_{ID}$ for wiring information in the anti-fuse element AF is supplied to the memory unit 206 and GND represents a ground potential. Note that the power supply voltages $V_{ID}$ and $V_H$ are separate power supply lines. If, however, a minimum voltage value required to write information in the anti-fuse element is equal to or smaller than the power supply voltage $V_H$, the power supply voltage $V_H$ may be used together with, for example, a voltage down circuit. The memory unit 206, in the anti-fuse element AF of which information is to be written, can be decided based on the control signal 205 and the time-divisional selection signal 203 according to the signals CLK, DATA, LT, and HE. The information written in the anti-fuse element AF can be read out by supplying the power supply voltage $V_{DD}$ to the memory unit 206, as will be described later.

Figure 2:
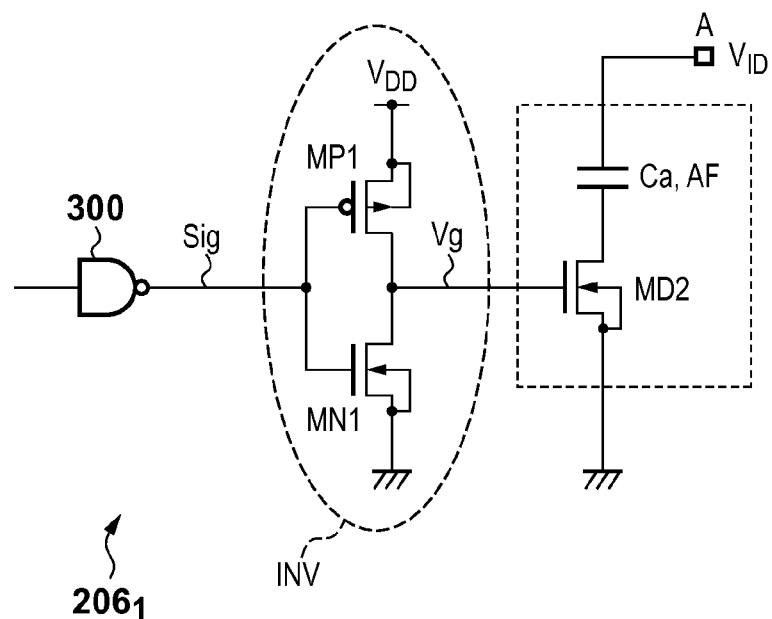
FIG. 2 is a circuit diagram for explaining an example of the arrangement of a memory unit according to the first embodiment.

FIG. 2 shows an example of the arrangement of a memory unit $206_1$ used for the substrate $I_1$. In this example, the AND circuit AND2 is represented by a NAND circuit 300 and an inverter INV. The inverter INV is formed from a PMOS transistor MP1 and NMOS transistor MN1, for which MOSFETs are used. The inverter INV receives an input signal Sig, and outputs an output signal Vg to the gate of the transistor MD2. One terminal of a capacitor Ca as the anti-fuse element AF is connected in series with the transistor MD2. When writing information, the power supply voltage $V_{ID}$ is supplied to the other terminal (terminal A) of the capacitor Ca.

Figure 3:
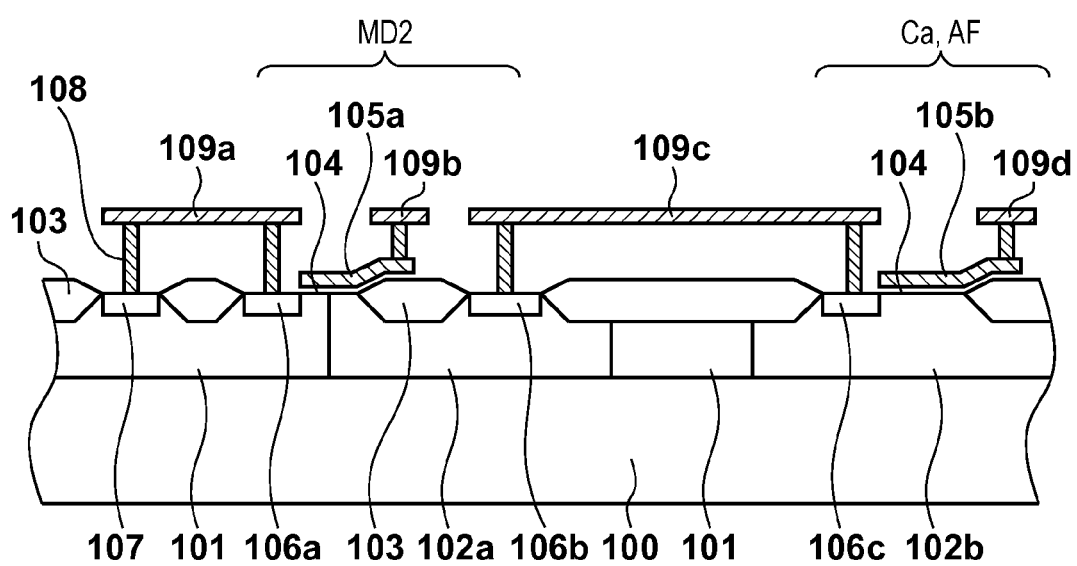
FIG. 3 is a view for explaining an example of the sectional structure of the memory unit according to the first embodiment.

FIG. 3 schematically shows an example of the device sectional structure of a portion corresponding to the capacitor Ca and transistor MD2. For example, p-type well regions 101 and n-type well regions 102a and 102b are formed on a p-type silicon substrate 100. The p-type well regions 101 need only be simultaneously formed in a step of forming the p-type well of the NMOS transistor MN1, and the p-type well and the p-type well regions 101 have similar impurity concentration distributions. The same goes for the relationship between the n-type well of the PMOS transistor MP1 and the n-type well regions 102a and 102b. Assume that a breakdown voltage at the p-n junction between the p-type silicon substrate 100 and the n-type well regions 102a and 102b is $V_B$. In this case, it is necessary to satisfy $V_B > V_{ID}$ so that no breakdown occurs at the p-n junction when writing information. Therefore, the n-type well regions 102a and 102b are preferably formed in consideration of the respective impurity concentrations.

An element isolation 103 has, for example, the LOCOS structure which can be formed by field oxidation. However, an element isolation 103 with the STI structure may be formed. Gate insulating films 104 are formed at the same time as the formation of the gate insulating films of the transistors MP1 and MN1, and their film thicknesses need only be, for example, about 7.5 to 18 nm when $V_{DD}$=3 to 5 V. A gate electrode 105a of the transistor MD2 and an electrode 105b of the capacitor Ca used as the anti-fuse element AF can be made of polysilicon. These electrodes can be formed at the same time as the formation of the gate electrodes of the transistors MP1 and MN1. Similarly, high-concentration n-type diffusion regions 106a to 106c and high-concentration p-type diffusion region 107 can be formed at the same time as the formation of high-concentration diffusion regions for the drains, sources, and bulks of the transistors MP1 and MN1. Therefore, in diffusion regions of the same conductivity type, the depths and impurity concentrations of impurity regions are equal to each other. Contacts 108 and wiring patterns 109a to 109d each made of a conductive material such as a metal are provided in the n-type diffusion regions 106a to 106c and p-type diffusion region 107, thereby establishing an electrical connection.

The gate electrode 105a of the transistor MD2 can be arranged, via the gate insulating film 104, on the p-type well regions 101 and n-type well region 102a which are adjacent to each other. The channel region of the transistor MD2 is formed in the p-type well region 101 under the gate electrode 105a. The n-type diffusion region 106a corresponds to the source of the transistor MD2. The n-type diffusion region 106b corresponds to the drain of the transistor MD2. The p-type diffusion region 107 corresponds to the back gate (bulk) of the transistor MD2. Furthermore, the n-type diffusion region 106b is formed to extend under the drain of the gate electrode 105a, which relaxes the electric field from the drain. The gate electrode 105a is formed to extend above the element isolation 103, and the transistor MD2 has a so-called LOCOS offset structure. The transistor MD2 forms the DMOS structure as described above, and has a high withstand voltage.

The ground potential GND is supplied to the wiring pattern 109a. The wiring pattern 109b electrically connects the gate electrode 105a of the transistor MD2 to the output of the inverter INV shown in FIG. 2, thereby inputting the signal Vg to the gate of the transistor MD2. The wiring pattern 109c connects the n-type diffusion region 106b (the drain of the transistor MD2) to the n-type diffusion region 106c (one of the electrodes of the anti-fuse element) via the contacts 108.

Figure 4:
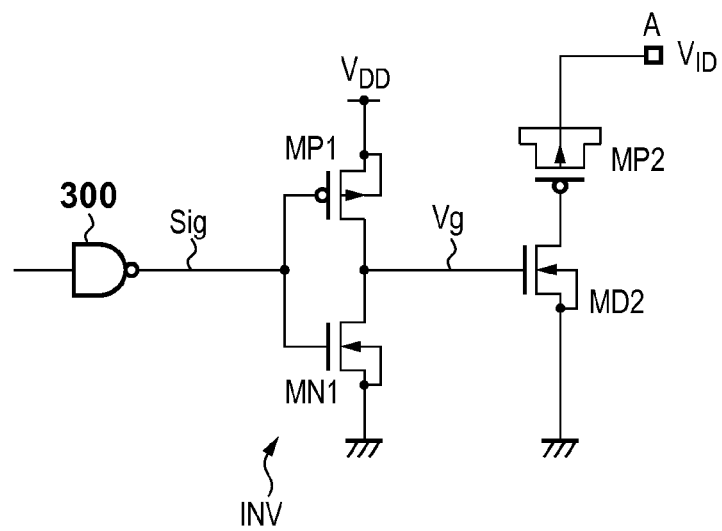
FIG. 4 is a circuit diagram for explaining another example of the arrangement of the memory unit according to the first embodiment.

The electrode 105b of the capacitor Ca used as the anti-fuse element AF corresponds to terminal A, and can be connected to the power supply line of the power supply voltage $V_{ID}$ via the contacts 108 and wiring pattern 109d. The positional relationship between the two terminals of the capacitor Ca may be opposite. That is, the n-type diffusion region 106c and the power supply line may be electrically connected to each other, and the electrode 105b and n-type diffusion region 106b may be electrically connected to each other. The n-type diffusion region 106c may be formed to extend under the electrode 105b. Furthermore, the capacitor Ca is formed from the n-type well region 102b and electrode 105b. As shown in FIG. 4, however, the capacitor Ca may be formed from the p-type well region of a PMOS transistor MP2 and the electrode 105b.

When writing information in the anti-fuse element AF, that is, when causing an insulation breakdown of the gate insulating film 104 of the MOS structure which forms the capacitor Ca, an overvoltage (power supply voltage $V_{ID}$) is supplied to the wiring pattern 109d. When an electric field of about 10 MV/cm or larger occurs in the gate insulating film 104, an insulation breakdown of the gate insulating film 104 can occur. If, for example, the film thickness of the gate insulating film 104 is 12 nm, a voltage of 12 V or higher is required. This insulation breakdown occurs when setting the transistor MD2 in a conductive state. More specifically, referring to FIG. 2, the signal Sig of low level is input to the inverter INV, which then outputs the signal Vg of high level to the gate of the transistor MD2, thereby setting the transistor MD2 in a conductive state.

As described above, the anti-fuse element AF is used to write unique information (an ID, setting parameters, and the like). For example, information can be written before shipping of a product including the substrate $I_1$ (a printing apparatus including the substrate $I_1$ or the like). For example, information need only be written while supplying the voltage from an inspection device or the like, and thus a voltage generation unit for generating a voltage required to write information need not be provided in the substrate $I_1$. Alternatively, information may be automatically written after shipping, for example, after the user starts to use the product. In this case, it is only necessary to write information while supplying the voltage from the product main body, a device used together with or in association with the product, or the like.

As described above, since no gate insulating film formation step is added to the manufacturing process of a printhead substrate including an anti-fuse element, this embodiment is advantageous in terms of the cost. The same goes for the formation of each well region, electrode, or the like.

Figure 5A:
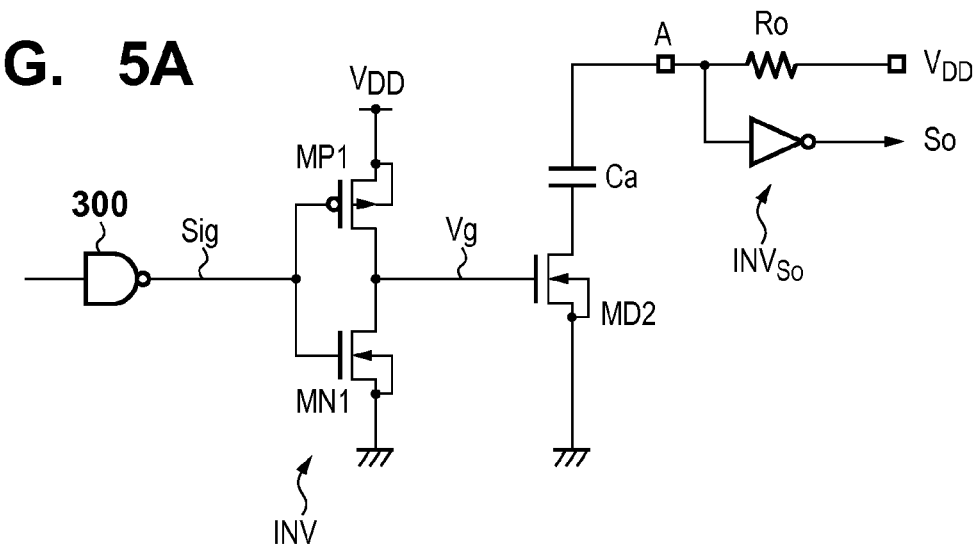
FIGS. 5A and 5B are circuit diagrams each for explaining an example of a readout method for the memory unit.
Figure 5B:
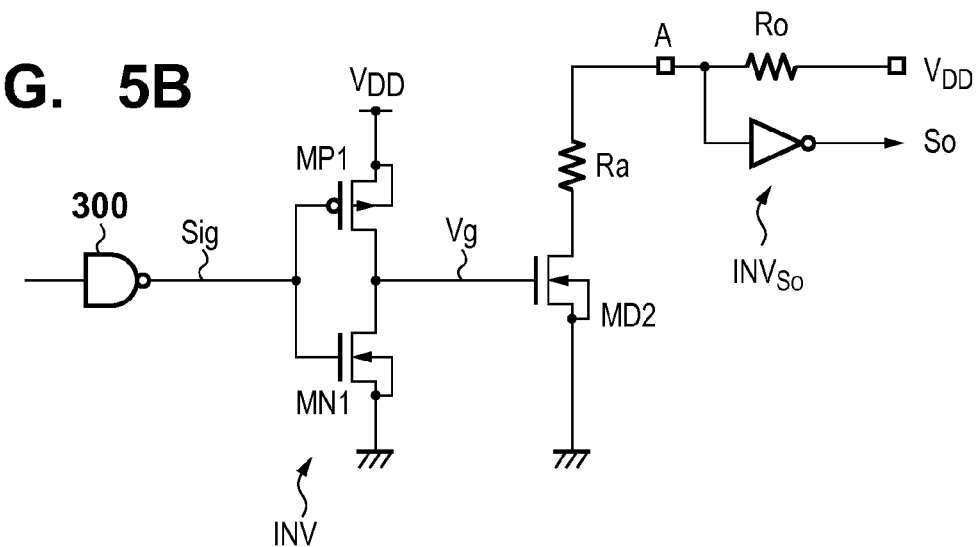

The information can be read out from the anti-fuse element AF by an arrangement as exemplified in FIG. 5A or 5B. FIG. 5A shows a state in which no information has been written in the anti-fuse element (a state in which no insulation breakdown has occurred). FIG. 5B shows a state in which information has been written in the anti-fuse element (a state in which an insulation breakdown has occurred). In this example, terminal A can be connected to, via an external resistor (to be referred to as an "external resistor Ro" hereinafter) with a resistance value Ro, the power supply line for supplying the power supply voltage $V_{DD}$. Furthermore, terminal A is also connected to an inverter $INV_{So}$, thereby reading out, as a signal So, the information written in the anti-fuse element AF. It is only necessary to set a sufficiently large resistance value for the external resistor Ro so that a readout operation to be described below is appropriately performed.

In the state (FIG. 5A) in which no information has been written in the anti-fuse element, the anti-fuse element AF simply functions as the capacitor Ca. Therefore, regardless of the high/low state of the control signal Sig (the conductive/non-conductive state of the transistor MD2), the potential Va of terminal A becomes $V_{DD}$. In the state in which no information has been written in the anti-fuse element, the signal So is always low.

In the state (FIG. 5B) in which information has been written in the anti-fuse element, the anti-fuse element AF functions as a resistor element (having a resistance value of Ra). When the control signal Sig is high (the transistor MD2 is in the conductive state), the potential Va is given by:

$$Va = V_{DD} \times (Ra+Rd)/(Ro+Ra+Rd) \quad (1)$$

where Rd represents the ON resistance value of the transistor MD2. If, for example, $V_{DD}$=3 V, Ro=10 kΩ, Ra=1 kΩ, and Rd=1 kΩ, the potential Va is about 0.5 V. This voltage is input to the inverter $INV_{So}$. Since about 0.5 V is lower than the threshold voltage of the inverter $INV_{So}$, the output signal So is set in the high state. On the other hand, if the control signal Sig is low (the transistor MD2 is in the non-conductive state), Va=$V_{DD}$ and thus the output signal So is set in the low state.

As described above, it is possible to read out whether information has been written in the anti-fuse element AF. The above-described readout method is merely an example, and may be realized by reading out the impedance of the anti-fuse element AF.

(Second Embodiment)

Figure 6:
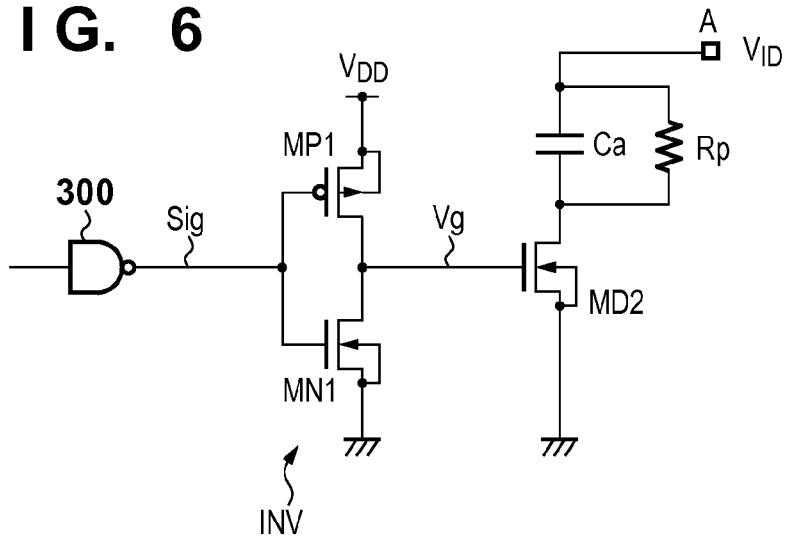
FIG. 6 is a circuit diagram for explaining an example of the arrangement of a memory unit according to the second embodiment.

A case in which a memory unit $206_2$ is used for a substrate $I_2$ will be described as another arrangement example with reference to FIGS. 6 and 7. FIG. 6 shows an example of the arrangement of the memory unit $206_2$. A transistor MD2 has an n-type well region 102a for relaxing the electric field on the drain side and, therefore, a leakage current may flow from an n-type diffusion region 106b (drain) to a silicon substrate 100 through the n-type well region 102a. The n-type diffusion region 106b has a potential equal to that of an n-type diffusion region 106c. In the above-described anti-fuse element AF (capacitor Ca), therefore, a leakage current may flow from the n-type diffusion region 106c to the silicon substrate 100 through an n-type well region 102b. Even though the transistor MD2 is in a non-conductive state, the potential difference between the source and drain of the transistor MD2 may become small and the potential difference across the anti-fuse element AF may become large. This may cause a problem that wrong information is written in the anti-fuse element AF.

To avoid such problem, the substrate $I_2$ of this embodiment further includes a resistor element (having a resistance value of Rp and to be simply referred to as a "resistor element Rp" hereinafter) which is connected in parallel with the anti-fuse element AF, as exemplified in FIG. 6. This can prevent a problem that an overvoltage is applied to terminal A and information is erroneously written in the anti-fuse element AF even though the transistor MD2 is in the non-conductive state.

To write information in the anti-fuse element AF, it is only necessary to input a signal Sig of low level to an inverter INV, as in the first embodiment. Note that a potential difference $V_{AF}$ generated across the anti-fuse element is given by:

$$V_{AF} = V_{ID} \times Rp/(Rp+Rd) \quad (2)$$

In consideration of a breakdown voltage $V_B$, with respect to the upper limit of the power supply voltage $V_{ID}$, it is necessary to set Rp to a value sufficiently larger than Rd. If, for example, Rp=50 kΩ and Rd=1 kΩ, $V_{AF}$=$V_{ID}$×50/51 and thus it is necessary to apply the voltage $V_{ID}$ which is 1.02 times that in the first embodiment in which no resistor element Rp is used. On the other hand, for example, if Rp=1 kΩ and Rd=1 kΩ $V_{AF}$=$V_{ID}$×1/2 and thus it is necessary to apply the voltage $V_{ID}$ which is twice that in the first embodiment in which no resistor element Rp is used. If, however, the voltage $V_{ID}$ in this case becomes higher than the breakdown voltage $V_B$, information cannot be successfully written in the anti-fuse element. Therefore, Rp needs to be set to a value sufficiently larger than Rd.

Figure 7A:
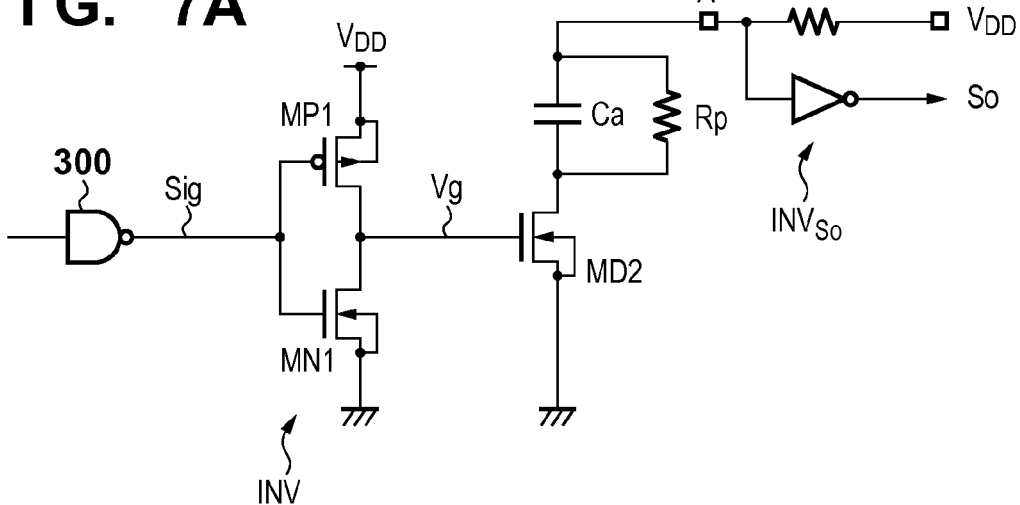
FIGS. 7A and 7B are circuit diagrams each for explaining an example of a readout method for the memory unit.

FIG. 7A shows a state in which no information has been written in the anti-fuse element (a state in which no insulation breakdown has occurred), similarly to FIG. 5A. In this state, the anti-fuse element AF simply functions as the capacitor Ca. When, therefore, the control signal Sig is high (the transistor MD2 is in a conductive state), a potential Va of terminal A is given by:

$$Va = V_{DD} \times (Rp+Rd)/(Ro+Rp+Rd) \quad (3)$$

If, for example, VDD=3 V, Ro=10 kΩ, Rp=50 kΩ, and Rd=1 kΩ, the potential Va is about 2.5 V. This voltage is input to an inverter $INV_{So}$. Since about 2.5 V is higher than the threshold voltage of the inverter $INV_{So}$, an output signal So is set in the low state. On the other hand, if the control signal Sig is low (the transistor MD2 is in the non-conductive state), Va=$V_{DD}$ and thus the output signal So is set in the low state. That is, in the state in which no information has been written in the anti-fuse element, the signal So is always low, irrespective of the high/low state of the control signal Sig (the conductive/non-conductive state of the transistor MD2).

Figure 7B:
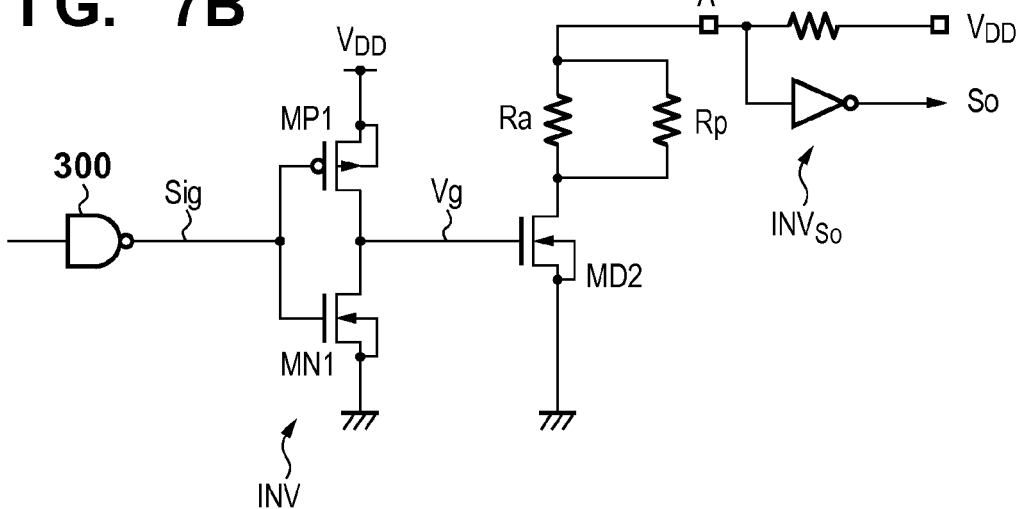

FIG. 7B shows a state in which information has been written in the anti-fuse element (a state in which an insulation breakdown has occurred), similarly to FIG. 5B. In this state, the anti-fuse element AF functions as a resistor element (having a resistance value of Ra). When the control signal Sig is high (the transistor MD2 is in the conductive state), the potential Va is given by:

$$Va = V_{DD} \times (R'+Rd)/(Ro+R'+Rd) \quad (4)$$

where R'=Ra×Rp/(Ra+Rp). If, for example, $V_{DD}$=3 V, Ro=10 kΩ, Rp=50 kΩ, Ra=1 kΩ, and Rd=1 kΩ, the potential Va is about 0.5 V. This voltage is input to the inverter $INV_{So}$. Since about 0.5 V is lower than the threshold voltage of the inverter $INV_{So}$, the output signal So is set in the high state. On the other hand, if the control signal Sig is low (the transistor MD2 is in the non-conductive state), Va=$V_{DD}$ and thus the output signal So is set in the low state.

Although the two embodiments have been described above, the present invention is not limited to them, and can be changed, as needed, in accordance with the objects, states, applications, functions, and other specifications. Other embodiments can also implement the present invention.

(Printing Apparatus)

The aforementioned embodiments are applicable to a printing apparatus. An application to a printing apparatus will be described below by exemplifying an inkjet printing apparatus with reference to FIGS. 8 to 10. The printing apparatus is not limited to this and, for example, the embodiments are equally applicable to a phase change printing apparatus, a dye-sublimation printing apparatus, and the like. The printing apparatus may be, for example, a single-function printer having only the printing function, or a multi-function printer having a plurality of functions such as the printing function, FAX function, and scanning function. The printing apparatus may be a manufacturing apparatus for manufacturing a color filter, electronic device, optical device, microstructure, or the like by a predetermined printing method. The term "print" can include not only the formation of images, designs, patterns, structures, and the like which are so visualized as to be visually perceivable by humans on a printing medium, but also the processing of the medium. The term "printing medium" can include not only paper used in general printing apparatuses, but also materials capable of accepting printing materials, such as cloth, plastic film, metal plate, glass, ceramics, resin, wood, and leather. The term "printing material" can include not only a liquid which, when applied onto a printing medium, can form images, designs, patterns, and the like or can process the printing medium, but also a liquid which can be used for printing material processing (for example, solidification or insolubilization of a coloring material contained in the printing material).

FIG. 8 schematically shows a printhead substrate 152 and ink supply unit in an inkjet printing method according to the present invention. The substrate 152 includes a plurality of heaters 141 (electrothermal transducers) arranged in correspondence with respective nozzles 153 (orifices) for discharging ink. When the heater 141 is driven, ink is heated to form bubbles, which are discharged from the corresponding nozzle 153. Each electrode 154 is used to supply a current to the corresponding heater 141, and can be electrically connected to, for example, a driving element (the aforementioned transistor MD1) for driving the heater 141. Each nozzle 153 is connected to a common ink chamber 157 through a corresponding ink channel 155 so as to be supplied with ink to be discharged. A member 156 has an internal groove to form the nozzles 153, channels 155, and common ink chamber 157.

FIG. 9 schematically shows the structure of the printhead in which the printhead substrate 152 is integrated into a frame 158. For example, a signal processing unit (not shown) processes externally input print data. As a result, an electrical signal based on the print data is input from a contact pad 159, and input to the printhead or the substrate 152 via a flexible printed board 160.

Figure 10:
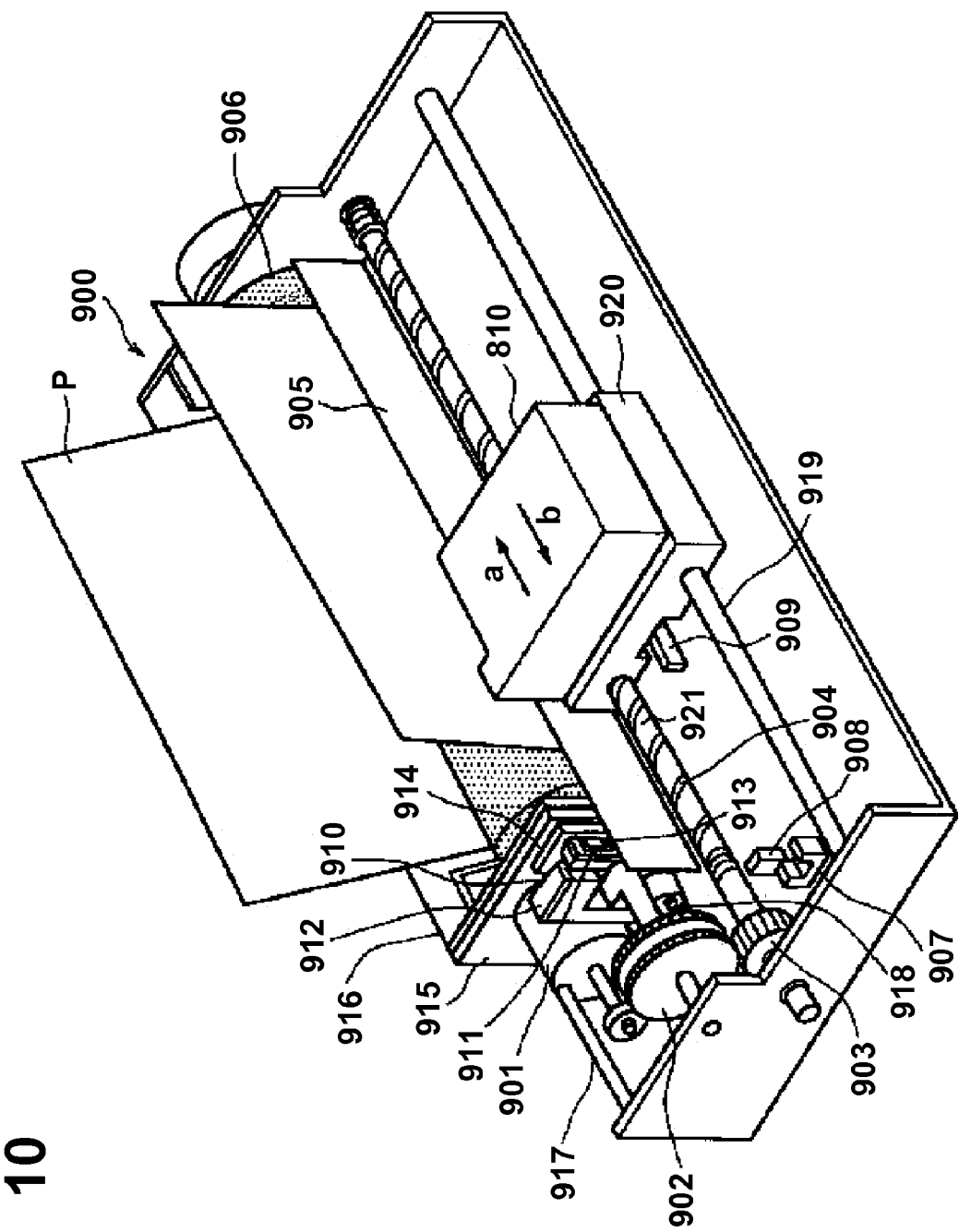
FIG. 10 is a view for explaining an example of the arrangement of a printing apparatus.

FIG. 10 is a bird's eye view showing a printing apparatus 900. A printhead 810 can be mounted on a carriage 920 together with ink tanks (printing material containers). The carriage 920 can be attached to a lead screw 904 with a spiral groove 921. As the lead screw 904 rotates, the printhead 810 can move together with the carriage 920 in the direction of an arrow a or b along a guide 919. The lead screw 904 rotates in synchronism with the rotation of a driving motor 901 via driving force transmission gears 902 and 903.

Printing paper P can be conveyed on a platen 906 by a conveying unit (not shown). A paper pressing plate 905 can press the printing paper P against the platen 906 along the carriage moving direction. The printing apparatus 900 can confirm the position of a lever 909 of the carriage 920 via photocouplers 907 and 908, and switch the rotating direction of the driving motor 901. A support member 910 can support a cap member 911 for capping each nozzle of the printhead 810. A suction unit 912 can evacuate the interior of the cap member 911, thereby performing suction recovery processing of the printhead 810 through a cap opening 913. A well-known cleaning blade can be used as a cleaning blade 914. A moving member 915 can move the cleaning blade 914 forward and backward. A main body support plate 916 can support the moving member 915 and cleaning blade 914. A lever 917 can be provided to start suction recovery processing. The lever 917 moves as a cam 918 which engages with the carriage 920 moves. A well-known transmission unit such as a clutch switch can control the driving force from the driving motor 901. A print control unit (not shown) can be provided in the printing apparatus 900. The printing apparatus 900 can control the driving of each mechanism according to an externally input electrical signal such as print data. The printing apparatus 900 can complete printing on the printing paper P by repeatedly reciprocating the printhead 810 and conveying the printing paper P by the conveying unit (not shown).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-205033, filed Sep. 18, 2012, which is hereby incorporated by reference herein in its entirety.

What is claimed is:

1. A printhead substrate comprising:
    an electrothermal transducer configured to heat a printing material;
    a first double-diffused metal oxide semiconductor transistor configured to drive the electrothermal transducer;
    a metal oxide semiconductor structure forming an anti-fuse memory element;
    a power supply line configured to provide a first voltage to be used to break down an insulating film of the metal oxide semiconductor structure;
    a second double-diffused metal oxide semiconductor transistor connected to the metal oxide semiconductor structure, and configured to break down the insulating film of the metal oxide semiconductor structure by providing the first voltage to the metal oxide semiconductor structure in a case where the second double-diffused metal oxide semiconductor transistor is in a conductive state; and
    a driving unit configured to drive the second double-diffused metal oxide semiconductor transistor to be in the conductive state.

2. The substrate according to claim 1, wherein film thicknesses of gate insulating films of the first double-diffused metal oxide semiconductor transistor, the second double-diffused metal oxide semiconductor transistor, and the metal oxide semiconductor structure are equal to each other.

3. The substrate according to claim 1, wherein in the first double-diffused metal oxide semiconductor transistor and the second double-diffused metal oxide semiconductor transistor, depths and impurity concentrations of impurity regions in each of which a channel region is formed are equal to each other.

4. The substrate according to claim 1, further comprising a resistor element connected in parallel with the anti-fuse memory element.

5. A printhead comprising:
a printhead substrate according to claim 1; and
a plurality of nozzles each configured to, as a corresponding electrothermal transducer of the printhead drives, discharge a printing material.

6. A printing apparatus comprising:
a printhead according to claim 5;
a printing material container configured to supply a printing material to a plurality of nozzles of the printhead; and
a signal processing unit configured to output a result of processing externally input print data to the printhead.

7. The substrate according to claim 4, wherein a leak path of a current exists between a semiconductor substrate, on which the second double-diffused metal oxide semiconductor transistor is formed, and a diffusion region, which is connected to the metal oxide semiconductor structure, of the second double-diffused metal oxide semiconductor transistor.

8. The substrate according to claim 4, wherein a resistance value of the resistor is larger than an ON resistance value of the second double-diffused metal oxide semiconductor transistor.

9. The substrate according to claim 1, further comprising:
a resistor connected to the metal oxide semiconductor structure for supplying power supply voltage to the metal oxide semiconductor structure through the resistor; and
an inverter connected to the metal oxide semiconductor structure for reading out the information written in the anti-fuse memory element.

10. The substrate according to claim 1, wherein the driving unit includes an inverter whose output is connected to a gate electrode of the second double-diffused metal oxide semiconductor transistor.

11. The substrate according to claim 1, wherein the second double-diffused metal oxide semiconductor transistor is configured to write information in the anti-fuse memory element by breaking down the insulating film of the metal oxide semiconductor structure.

12. The substrate according to claim 1, wherein the driving unit includes at least one metal oxide semiconductor transistor.

13. The substrate according to claim 1, wherein the anti-fuse memory element is programmable only once.

14. A printhead substrate comprising:
an electrothermal transducer configured to heat a printing material;
a first double-diffused metal oxide semiconductor transistor configured to drive the electrothermal transducer;
a metal oxide semiconductor structure forming an anti-fuse memory element;
a power supply line configured to provide a first voltage to be used to break down an insulating film of the metal oxide semiconductor structure; and
a second double-diffused metal oxide semiconductor transistor connected to the metal oxide semiconductor structure, and configured to break down the insulating film of the metal oxide semiconductor structure by providing the first voltage to the metal oxide semiconductor structure in a case where the second double-diffused metal oxide semiconductor transistor is in a conductive state.

15. The substrate according to claim 14, wherein the second double-diffused metal oxide semiconductor transistor is configured to write information in the anti-fuse memory element by breaking down the insulating film of the metal oxide semiconductor structure.

16. A printhead substrate comprising:
an electrothermal transducer configured to heat a printing material;
a first double-diffused metal oxide semiconductor transistor configured to drive the electrothermal transducer;
a metal oxide semiconductor structure forming an anti-fuse element;
a second double-diffused metal oxide semiconductor transistor connected to the metal oxide semiconductor structure;
a driving unit configured to drive the second double-diffused metal oxide semiconductor transistor; and
a resistor element connected in parallel with the anti-fuse element,
wherein a resistance value of the resistor is larger than an ON resistance value of the second double-diffused metal oxide semiconductor transistor.

17. The substrate according to claim 1, wherein the first voltage is equal to or larger than a breakdown voltage of the insulating film of the metal oxide semiconductor structure.

18. The substrate according to claim 1, wherein the driving unit is provided with a second voltage smaller than the first voltage.

19. The substrate according to claim 1, wherein the insulating film of the metal oxide semiconductor structure has a thickness such that:
the insulating film of the metal oxide semiconductor structure is broken down in a case where the first voltage is provided to the metal oxide semiconductor structure; and
the insulating film of the metal oxide semiconductor structure is not broken down in a case where a voltage for readout of information is provided to the metal oxide semiconductor structure, wherein the voltage for readout of information is smaller than the first voltage.

20. The substrate according to claim 1, wherein the insulating film of the metal oxide semiconductor structure has a thickness in a range from 7.5 nm to 18 nm.

21. A printhead substrate comprising:
an electrothermal transducer configured to heat a printing material;
a first double-diffused metal oxide semiconductor transistor configured to drive the electrothermal transducer;
a first power supply line configured to provide a first voltage;
a second power supply line configured to provide a second voltage;
a metal oxide semiconductor structure forming an anti-fuse memory element, including a first node and a second node; and
a second double-diffused metal oxide semiconductor transistor including a source and a drain,
wherein the first power supply line is connected to the first node of the anti-fuse memory element,
wherein one of the source and the drain is connected to the second node of the anti-fuse memory element,
wherein the other of the source and the drain is connected to the second power supply line,
wherein the second double-diffused metal oxide semiconductor transistor is configured to break down the insulating film of the metal oxide semiconductor structure in a case where the second double-diffused metal oxide semiconductor transistor is in a conductive state, and
wherein the first voltage and the second voltage are set such that a voltage to break down the insulating film is supplied between the first node and second node of the anti-fuse memory element in a case where the second double-diffused metal oxide semiconductor transistor is in the conductive state.

22. The substrate according to claim 21, wherein the voltage to break down the insulating film is equal to or larger than a breakdown voltage of the insulating film of the metal oxide semiconductor structure.

23. The substrate according to claim 21, wherein a difference between the first voltage and the second voltage is equal to or larger than a breakdown voltage of the insulating film of the metal oxide semiconductor structure.

24. The substrate according to claim 1, wherein the insulating film of the metal oxide semiconductor structure has a thickness in a range from 7.5 nm to 18 nm.

* * * * *